United States Patent
Eckert et al.

(10) Patent No.: US 9,804,231 B2
(45) Date of Patent: Oct. 31, 2017

(54) POWER NOISE HISTOGRAM OF A COMPUTER SYSTEM

(71) Applicant: GLOBALFOUNDRIES Inc., Grand Cayman (KY)

(72) Inventors: Martin Eckert, Moetzingen (DE); Hubert Harrer, Schoenaich (DE); Thomas Strach, Wildberg (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 861 days.

(21) Appl. No.: 14/246,376

(22) Filed: Apr. 7, 2014

(65) Prior Publication Data

US 2014/0316725 A1 Oct. 23, 2014

(30) Foreign Application Priority Data

Apr. 23, 2013 (GB) .................................. 1307294.7

(51) Int. Cl.
*G01R 31/00* (2006.01)
*G01R 31/40* (2014.01)
*G06F 1/26* (2006.01)
*G06F 11/30* (2006.01)

(52) U.S. Cl.
CPC ............... *G01R 31/40* (2013.01); *G06F 1/26* (2013.01)

(58) Field of Classification Search
CPC ....................................................... G01R 31/40
See application file for complete search history.

(56) References Cited

U.S. PATENT DOCUMENTS

| 7,313,747 | B2 | 12/2007 | Bowling et al. | |
|---|---|---|---|---|
| 2005/0107970 | A1 | 5/2005 | Franch et al. | |
| 2007/0103141 | A1* | 5/2007 | Dixon | G01R 31/31725 324/76.63 |
| 2008/0309364 | A1 | 12/2008 | Joshi et al. | |
| 2012/0013353 | A1 | 1/2012 | Frech et al. | |

OTHER PUBLICATIONS

Search Report for UK Application No. GB 1307294.7 (filed Apr. 23, 2013), dated Oct. 2, 2013 (3 pages).
Franch et al., "On-Chip Timing Uncertainty Measurements on IBM Microprocessors", IEEE International Test Conference, Oct. 2008 (8 pages).

* cited by examiner

*Primary Examiner* — Phuong Huynh
(74) *Attorney, Agent, or Firm* — Heslin Rothenberg Farley & Mesiti P.C.

(57) ABSTRACT

A method is provided for determining a power noise histogram of a computer system. The computer system includes a skitter circuit with multiple skitter bins, each skitter bin of the multiple skitter bins being connected to a signal line at one or more clock cycles. The method includes: connecting each skitter bin to an individual counter circuit; and incrementing a counter when the respective skitter bin is enabled.

17 Claims, 10 Drawing Sheets

POWER NOISE HISTOGRAM OF A COMPUTER SYSTEM

PRIOR FOREIGN APPLICATION

This application claims priority from United Kingdom patent application Serial No. GB 1307294.7, filed Apr. 23, 2013, which is hereby incorporated herein by reference in its entirety.

TECHNICAL FIELD

The present invention relates in general to data processing systems, and in particular, to a method and an apparatus for determining a power noise histogram of a computer system.

BACKGROUND

Mid frequency or power noise, respectively, is caused by switching events in high speed digital circuits and is causing voltage droops in the power supply. The magnitude of the noise depends on many different factors, which can be separated into deterministic components like packaging path, frequency, power supply path, capacitances between voltage and ground and statistical technology factors like leakage current, capacitor decharging process tolerances and aging effects, as well as workloads. The state of the art procedure to quantify the mid frequency noise is to measure on selected computer systems the noise via analog oscilloscope measurements and digital skitter circuits and worst case the margin for the voltage.

The disadvantage is a very conservative handling as the measurements on a few test computer systems do not give a representative description in order to derive a statistical evaluation and does not allow a feedback loop in a manufacturing system. Furthermore, this approach does not allow for an individual treatment of a specific computer system. A conservative power supply margin needs to be added resulting in higher power consumption and/or less performance/yield.

Furthermore, as technology features continue to shrink, power bus noise is becoming the dominant contributor to total timing uncertainty. High speed circuit switching may cause large, narrow current spikes with very rapid rise and fall times, i.e., large gradients in current. Voltage noise can also be very localized in its impact, depending on many factors such as the robustness of the power distribution grid. When the noise dissipates and the on-chip voltage supply later recovers, or even overshoots as the supply current falls, the circuits (buffers, gates, etc.) in these same paths speed up, returning to their nominal performance (with the normal stage delay) or even faster. The number of stages that can complete changes as the data path slows down or speeds up relative to the clock path.

In particular, such switching noise is an important component of total timing uncertainty, more even than skew or jitter (which are themselves affected by switching noise) or chip process variations. Clock skew and jitter, power supply noise and chip ambient and process variations may be considered the primary sources of timing uncertainty. In particular, the overall or total timing uncertainty is a complex combination of both clock and data path uncertainty that reduces the number of combinational logic stages that can be certifiably completed in any clock cycle and so, reduces chip performance.

In US 2005/0107970 A1, a circuit for measuring timing uncertainties in a clocked data path is described. A local clock buffer receives a global clock and provides a complementary pair of local clocks. A first local (launch) clock is an input to a delay line, e.g., 3 clock cycles worth of series connected inverters. Delay line taps (inverter outputs) are inputs to a register that is clocked by the complementary clock pair to capture progression of the launch clock through the delay line and identify any variation (e.g., from power bus noise or jitter) in that progression. Skew can be measured by cross coupling launch clocks from a pair of such clock buffers and selectively passing the local and remote launch clocks to the respective delay lines.

US 2007/0103141 A1 further describes a circuit and method for measuring duty cycle uncertainty in an on-chip global clock. A global clock is provided to a delay line at a local clock buffer. Delay line taps are inputs to a register that is clocked by the local clock buffer. The register captures clock edges, which are filtered to identify a single location for each edge. Imbalance in space between the edges indicated imbalance in duty cycle. Up/down signals are generated from any imbalance and passed to a phase locked loop to adjust the balance.

BRIEF SUMMARY

According to one embodiment of the present invention, a method is presented which includes: determining a power noise histogram of a computer system, the computer system comprising a skitter circuit with multiple skitter bins, the skitter bins each being connected to a signal line at one or more clock cycles. The determining includes: connecting each skitter bin to an individual counter circuit; and incrementing the counter when the respective skitter bin is enabled.

According to another embodiment of the present invention, an apparatus is provided for determining a power noise histogram of a computer system. The apparatus includes: a skitter circuit with multiple skitter bins, the skitter bins each being connected to a signal line at one or more clock cycles; and each skitter bin being connected to an individual counter circuit for incrementing a counter when the respective skitter bin is enabled.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

The present invention together with the above-mentioned and other objects and advantages may best be understood from the following detailed description of the embodiments, but not restricted to the embodiments, wherein is shown in.

DETAILED DESCRIPTION

In the drawings, like elements are referred to with similar reference numerals. The drawings are merely schematic representations, not intended to portray specific parameters of the invention. Moreover, the drawings are intended to depict only typical embodiments of the invention and therefore should not be considered as limiting the scope of the invention.

Figure 1:
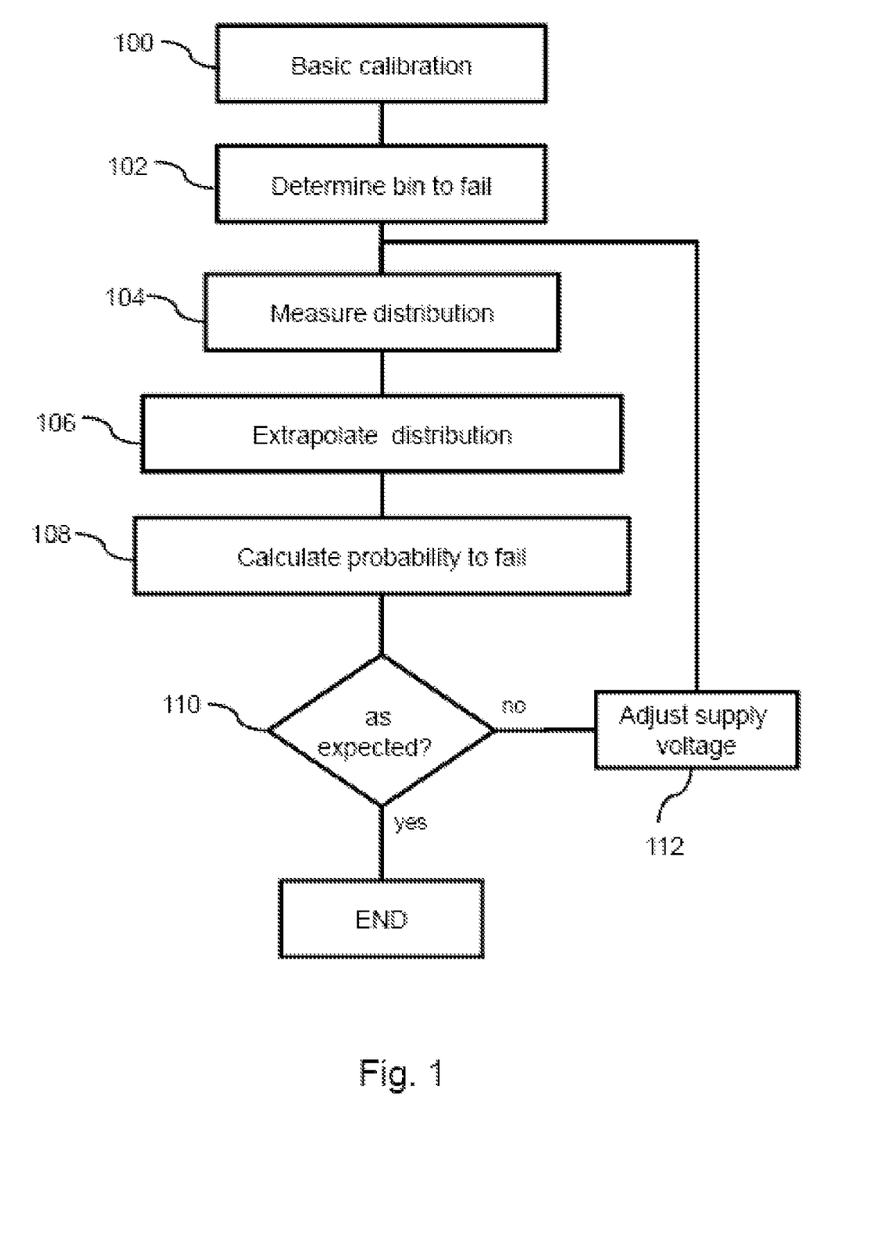
FIG. 1 a basic flow diagram for determining a power noise histogram including a feedback loop, according to an embodiment of the invention.

FIG. 1 displays a basic flow diagram for determining a power noise histogram including a feedback loop according to an embodiment of the invention in order to explain one embodiment of the inventive method in overall view. The method for determining a power noise histogram of a computer system, said computer system comprising a skitter circuit with multiple skitter bins, said skitter bins each being connected to a signal line at one or more clock cycles, comprises connecting each skitter bin to an individual counter circuit and incrementing a counter when the respective skitter bin is enabled. In step 100 a basic calibration of the skitter circuit is being performed by determining a voltage value for each skitter bin. This value is stored in a lookup table for further use. Then in step 102 a voltage, in the form of a bin respectively, is identified where the computer system is beginning to fail. This is achieved by reducing the supply voltage of the computer system and observing checkers. This procedure may be performed at the manufacturing area of the computer system. Next in step 104 a count distribution is measured in the counter circuit connected to the skitter circuit by first activating the on-chip skitter counters and starting the measurement during operation of the computer system. This may be done at the manufacturing area and continued later at a customer site. The count distribution can be transformed to a voltage distribution using the calibration data in the lookup table. Then the voltage distribution is extrapolated at the boundaries of the measured skitter bin range, step 106. Therefore the measured voltage distribution is used together with an approximation of the distribution for voltage values smaller than the skitter bin resolution, representing virtual skitter bins. Next a probability for the computer system to fail for a given workload is calculated in step 108. That requires to integrate the area below the voltage distribution left and right of the skitter bin where the computer system begins to fail and which was determined in step 102. Now the probability to fail can be calculated which may in any cases amount to values greater than zero. If the calculated probability is not as expected, which is checked in step 110, the supply voltage may be adjusted, step 112, and the corresponding voltage distribution may be measured again, until an expected probability to fail may result. Alternatively, the executed program could be changed in a way that the voltage distribution has a smaller width than before and staying at the same mean voltage, which means that the program may be designed for lowest noise resulting.

Figure 2:
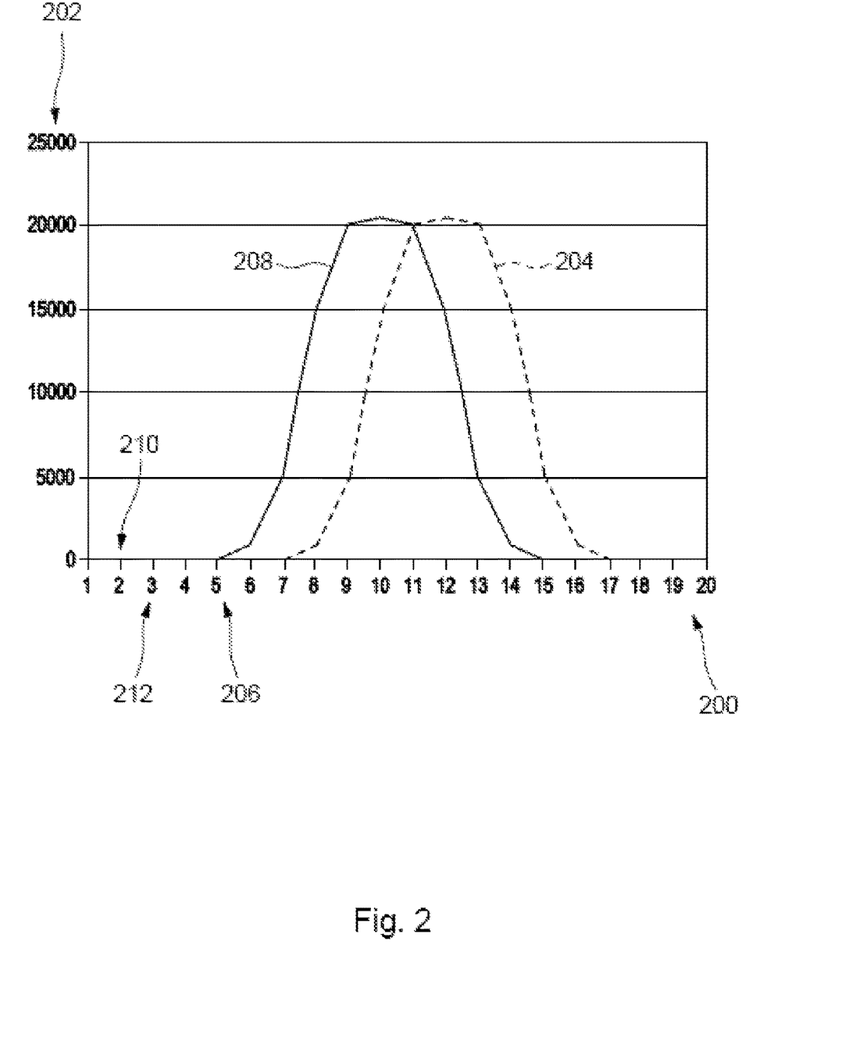
FIG. 2 two measurements of a voltage distribution with a skitter circuit showing different test programs and systems tested, resulting in eventually different mean voltages as performed, e.g., in a manufacturing calibration process, according to an embodiment of the invention.

In FIG. 2, two measurements 204, 208 of a voltage distribution with a skitter circuit showing different test programs and systems tested, resulting in eventually different mean voltages as performed e.g. in a manufacturing calibration process according to an embodiment of the invention is shown. FIG. 2 represents a measurement 204 of one skitter circuit on one chip under test. The x-axis 200 shows a lowest skitter bin 206 found for a nominal run of a test program which runs error free in the distribution 204. The y-axis 202 shows the respective counts for each skitter bin found. Multiple test runs with reduced supply voltages are performed until a fail bin 210 will be reached in distribution 208, which means a skitter bin with a corresponding voltage has been identified where the computer system begins to fail. The duration of the measurement time is chosen favorably less than the run time of the entire test program. The fail bin 210 and the lowest skitter bin 206 of distribution 204 as well as a guard band, which is the difference between the lowest skitter bin 206 and the fail bin 210 are stored in a data base. Also, the probability for the computer system to fail is determined and stored.

FIG. 2 shows a fail bin 210 at skitter bin 2, lowest skitter bin 210 at 5 and resulting guard band of 3 bins. A critical voltage limit 212, serving as a predefined alert threshold limit, may thus be set to a value in between, favorably a skitter bin 3. This value may be translated into an alert fail probability, too.

Figure 3:
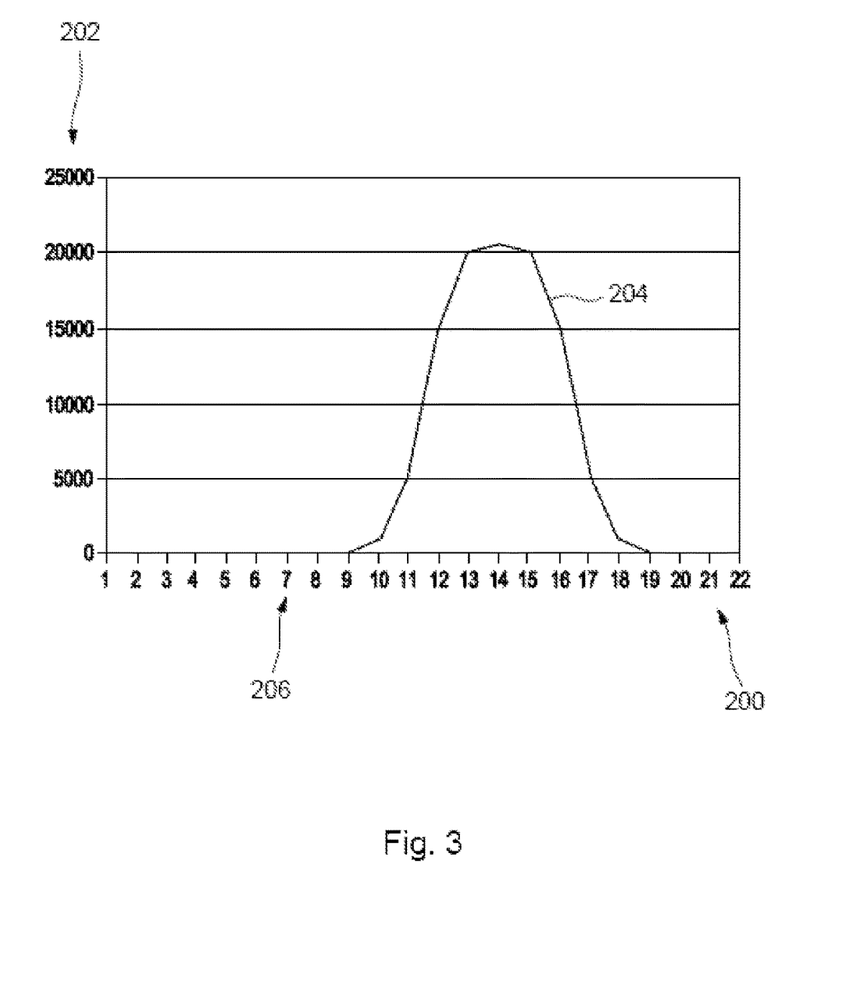
FIG. 3 a measurement of a voltage distribution with a skitter circuit showing a higher mean voltage as performed, e.g., at a customer field, according to an embodiment of the invention.

FIG. 3 displays a measurement of a voltage distribution with a skitter circuit showing a higher mean voltage as performed e.g. at a customer field according to an embodiment of the invention. Under real environmental conditions with respect to customer workload and the like the measurement may be repeated and results also stored. The example distribution 204 in FIG. 3, where x-axis 200 and y-axis 202 represent the same values as in FIG. 2, shows a measured lowest skitter bin 206 at bin 7. From this value another probability for the computer system to fail can be determined for this scenario.

Under the assumption of an exponential decay $e^{-x}$ an extrapolation at the boundaries of the measured skitter bins may be performed by using a half-value width of the distribution:

$$y = k * 2^{-(x/b)}$$

where x and y are as defined in the axis 200 and 202 respectively, and b equals the half-value voltage $V_{0.5}$, which is shown to be determined below, k is a constant to be fitted from the measured distribution. Favorably the last 3 measured skitter bins may be used to identify the exponential decay more precisely and run the curve fitting. This approximation serves to allow a calculation of the integral left and right of the fail bin position 210 below the exponential curve, and may favorably serve at the end of the process to calculate the voltage adjustment.

Figure 4:
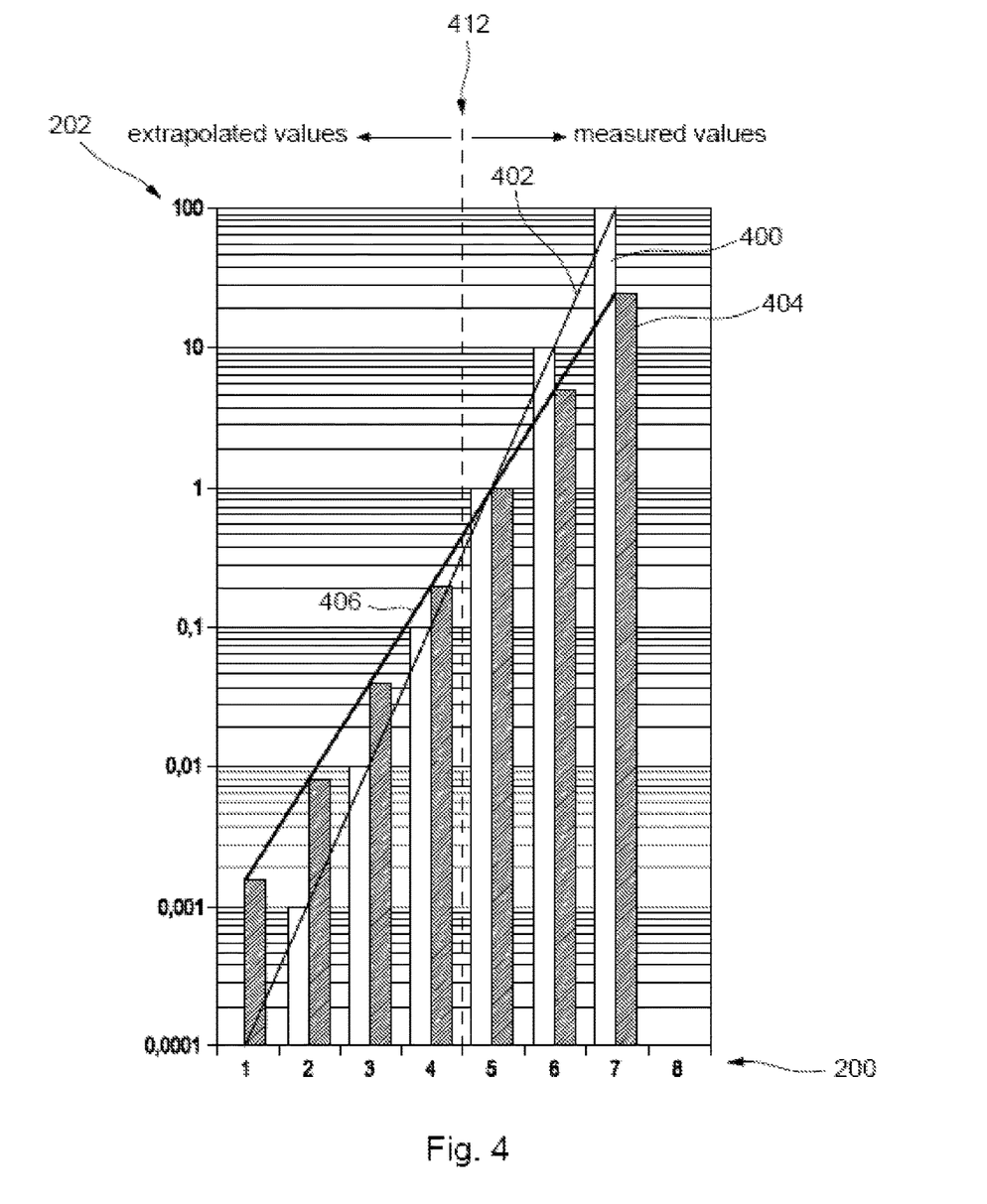
FIG. 4 two different extrapolations of two skitter bin distributions based on an exponential approximation, according to an embodiment of the invention.

FIG. 4 shows a result of two different extrapolations of two skitter bin distributions based on an exponential approximation like $e^{-x}$, with x as defined above in axis 200, according to an embodiment of the invention. Skitter bins realized in hardware can only represent discrete values. In order to continue the exponential curve at boundaries of the hardware implemented skitter bin range an extrapolation is performed. In FIG. 4 the values right of the line 412 are measured values, whereas the values left are extrapolated values. In this example the values below the curves are continued either by a factor of 5 (skitter bins 404, and exponential curve 406) or by 10 (skitter bins 400, and exponential curve 402). For the extrapolation an exponential decay is assumed. That means, each step from one skitter bin to the next bin represents a 10 times or 5 times, respectively, increase/reduction of the measurement duration before the fail bin is actually hit. When following the half-value width method, a certain portion of a skitter bin leads to a duplication/bisection of the measurement duration before the fail bin is actually hit. A bin portion could be more or less than a single skitter bin. Accordingly this portion can be called half-value voltage $V_{0.5}$.

Figure 5:
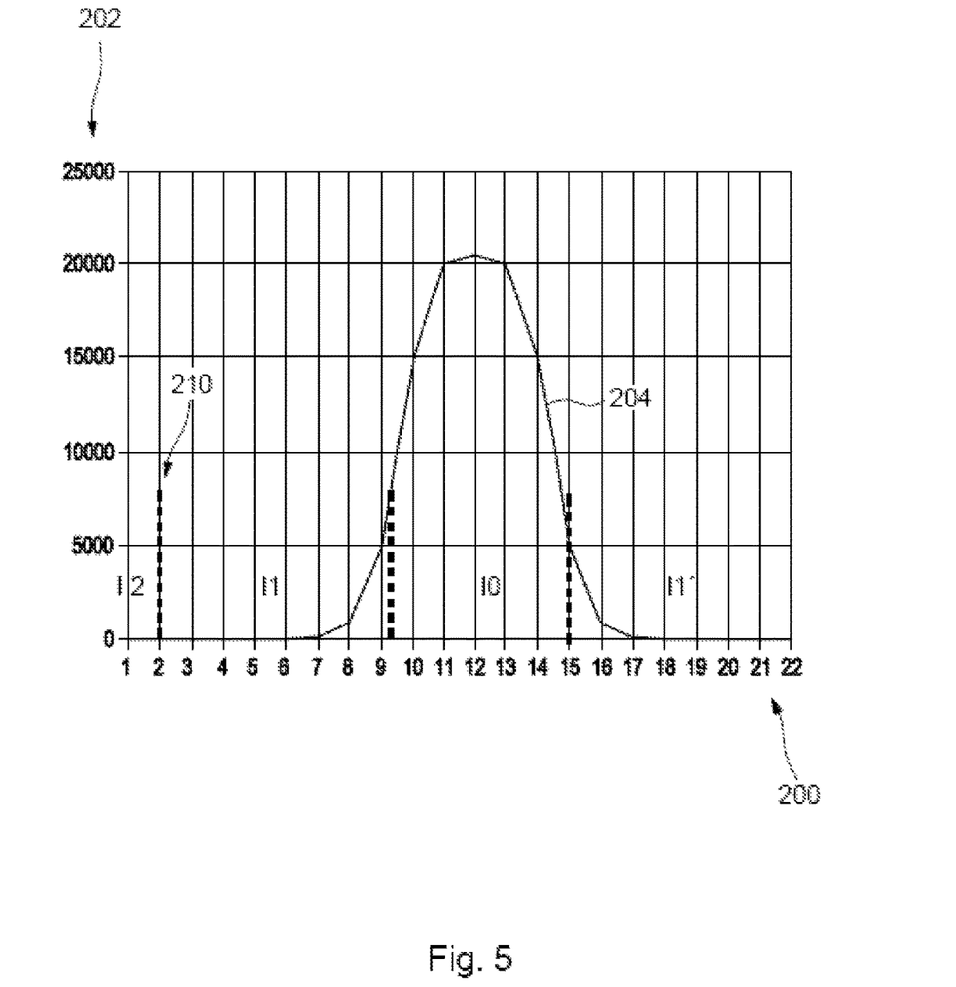
FIG. 5 a definition of a probability for a computer system to fail from an extrapolated skitter bin distribution, according to an embodiment of the invention.

FIG. 5 depicts a definition of a probability for a computer system to fail from an extrapolated skitter bin distribution according to an embodiment of the invention. The FIG. 5 shows a measured skitter bin distribution 204 in the range I0. Ranges I1, I1' and I2 represent the extrapolated distribution. Ranges I1 and I2 are separated by a skitter bin 210 which represents a fail bin where the computer system begins to fail. A probability for a computer system to fail may then be defined from an extrapolated skitter bin distribution according to:

$FP$=ratio of integral $I2/(I0+I1+I2+I1')$

In order to determine the half-value voltage $V_{0.5}$ a calibrated skitter bin voltage Vcal may be multiplied by the probability to fail FP:

$V_{0.5}=FP*V$cal.

Thus, a correlation between a critical voltage limit and the probability for the computer system to fail may be calculated.

Figure 6:
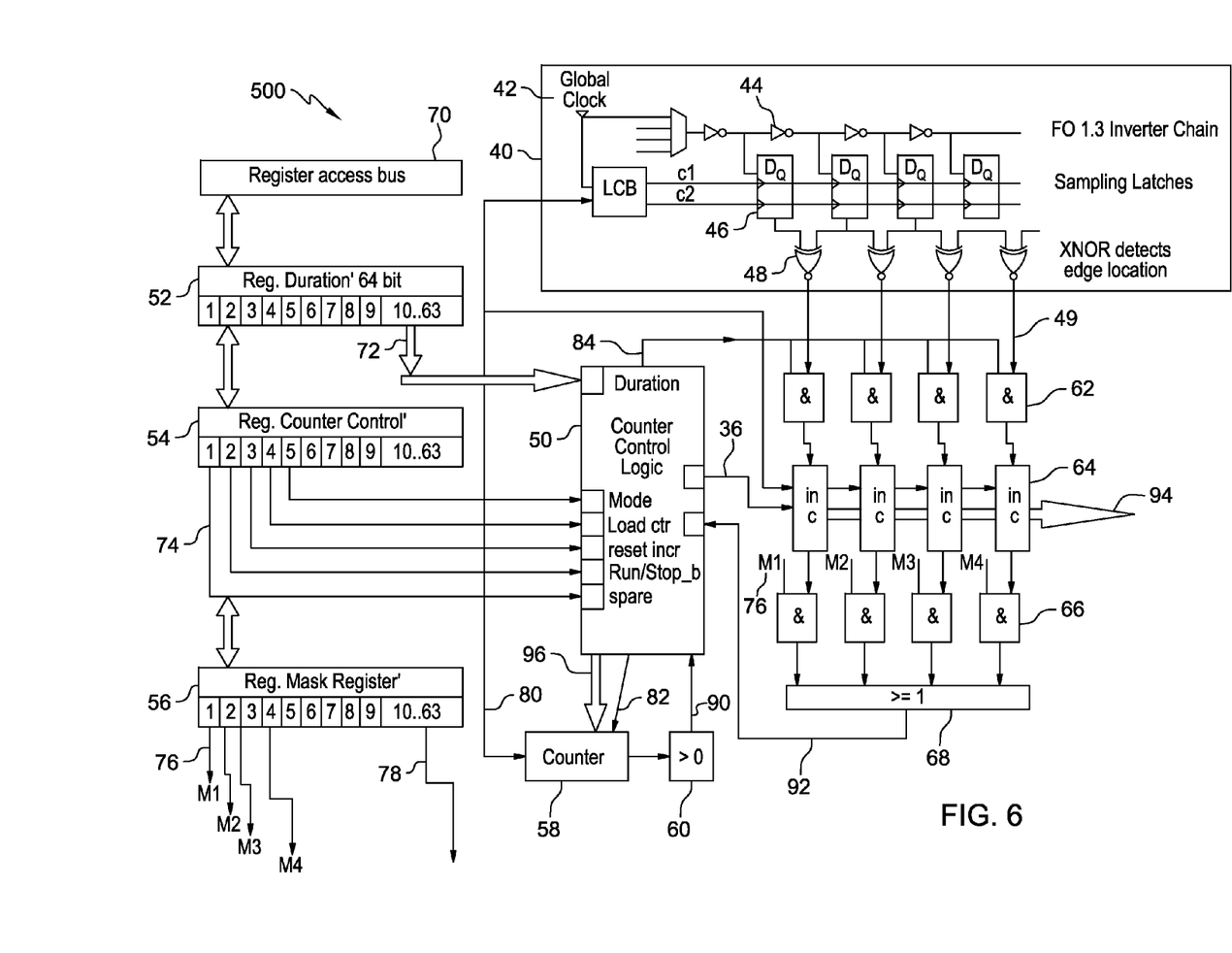
FIG. 6 a hardware implementation of a skitter circuit with a counter circuit, according to an embodiment of the invention.

FIG. 6 now displays a hardware implementation 500 of a skitter circuit 40 with a counter circuit 64 according to an embodiment of the invention. In the FIG. 6 a state of the art skitter circuit 40 is shown which is operated by inserting a signal (clocked by a clock signal 42) into an inverter chain 44 and capturing by a second signal. As part of the skitter circuit 40 sampling latches 46 as well as skitter bins realized as XNOR gates 48 for detection of edge locations are shown which then deliver signal outputs 49 fed to a counter circuitry. The counting process is performed by the counting circuitry comprising AND gates 62 for enabling incremental counting, counter circuits 64 and AND gates 66 for masking carry/overflow bits, connected to a combinational logic 68 acting as a wide OR-circuitry. Signal 94 represents reading bus for increments and counter logic signals as a comparator signal gt0 90, overflow 92 and counter values. The whole counting process is controlled by a counter control logic 50, typically implemented as a state machine, which gets input from different registers 52, 54. First there is a logic element 70 for bus access, which may be connected to register infrastructure of the chip, and which delivers information to a duration register 52, to a counter control register 54, as well as to a mask register 56. Duration information is fed to the counter control logic 50 via signal 72, whereas different information like mode, load counter, reset increment, run/stop signal are fed from the counter control register 54 through signal 74 to the counter control logic 50. The mask register 56 delivers mask information 76 to the mask gates 66. Clock signal 80 synchronizes skitter circuit and counter 58. Clock signal 80 is also fed to the counter circuits 64. The counting process is controlled by an increment enable signal 84 from the counter logic 50, whereas a reset increment signal 86 may be fed to the counter circuits 64. Load value signal 96 and counter enable signal 82 are fed to the counter signal 58, which operates as a decrementing circuit.

The comparator 60 provides the output gt0 of false (=0) through signal 90 connected to input of counter control logic 50 and is able to stop the counting process through signal 82. Alternatively an overflow condition indicated via signal any_ovfl 92 generated by OR-circuitry 68 fed to counter control logic 50 can stop the counter, too. An additional feature (not shown in FIG. 6) would be that the stop counting trigger event might even be initiated by a programmable compare value in the comparator 60.

Thus, in FIG. 6 an apparatus comprising means for: calibrating the skitter bins 48 by determining a voltage corresponding to each skitter bin 48; defining a critical voltage limit; measuring a voltage distribution during computer system operation for a range of skitter bins 48; extrapolating the voltage distribution beyond the boundaries of the range of skitter bins 48; calculating a probability of the computer system from the extrapolated voltage distribution to reach the predefined critical voltage limit is demonstrated.

It should be mentioned that the counter circuits 64 may be implemented as an on-chip skitter counter circuit and that means for extrapolating the voltage distribution beyond the boundaries of the range of skitter bins 48 may be implemented on the on-chip skitter counter circuit. Also means for calculating a probability of the computer system to fail from the extrapolated voltage distribution may be implemented on the on-chip skitter counter circuit.

Figure 7:
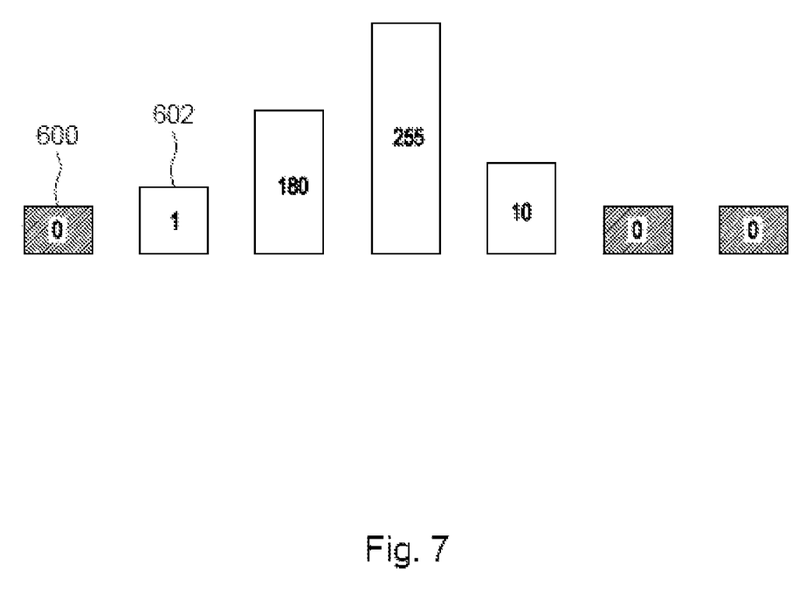
FIG. 7 a typical skitter histogram, according to an embodiment of the invention.

FIG. 7 shows a typical skitter histogram according to an embodiment of the invention, as measured from an example. Several skitter bins are displayed, where the central four skitter bins 602 exhibit count values greater than zero, whereas the skitter bins 600 at the edges do not exhibit any counts. The example histogram shown typically may be registered with an 8 bit increment depth and 1 overflow bit.

Figure 8:
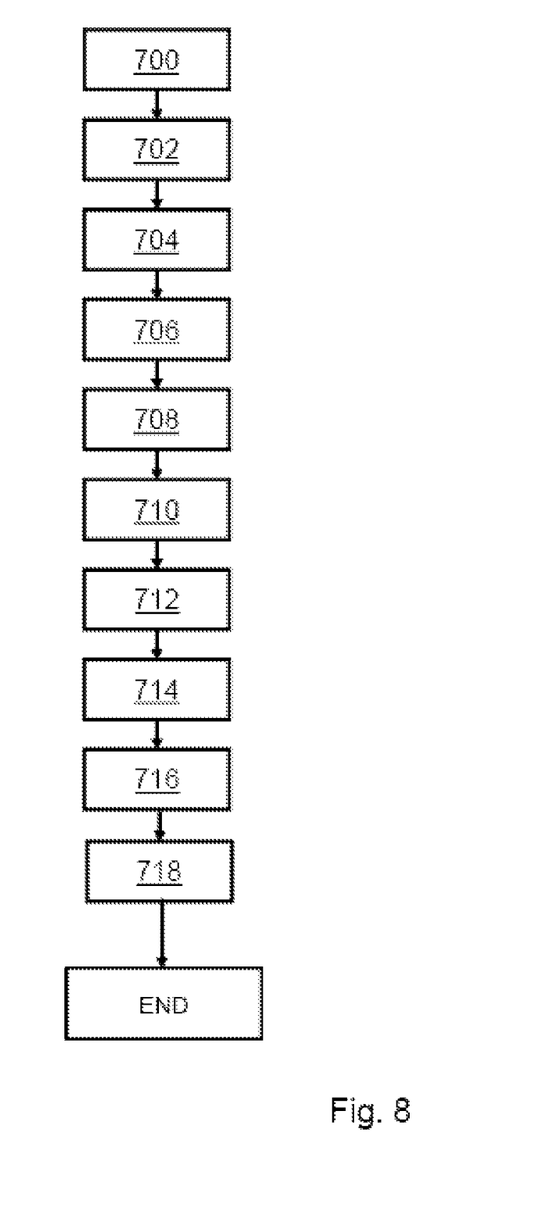
FIG. 8 a flowchart of a counting process for counting all skitter bins in parallel, according to an embodiment of the invention.

In FIG. 8 a flowchart of a counting process for counting all skitter bins in parallel according to an embodiment of the invention is shown. The process starts at step 700 with loading the measurement duration, followed by step 702 with setting the mode bit to the mode for counting all skitter bins in parallel. Next, step 704 all mask bits are disabled, resulting in all increment counters to be active. Then in step 706 the increment registers are reset, followed by step 708, where the test program is activated. Then in step 710 the measurement is started. Then in step 712 the comparator signal gt0 is polled with the result 0, meaning that the counter has reached zero and thus the measurement is completed. In step 714 the increment content is read, followed by step 716, stopping the test program. Then finally in step 718, a probability to fail, dividing the increment value by the duration of the measurement, may be calculated. It should be mentioned that this calculation is only valid if the corresponding increment value is not in an overflow situation, otherwise the measurement duration may be reduced and the measurement started again.

Figure 9:
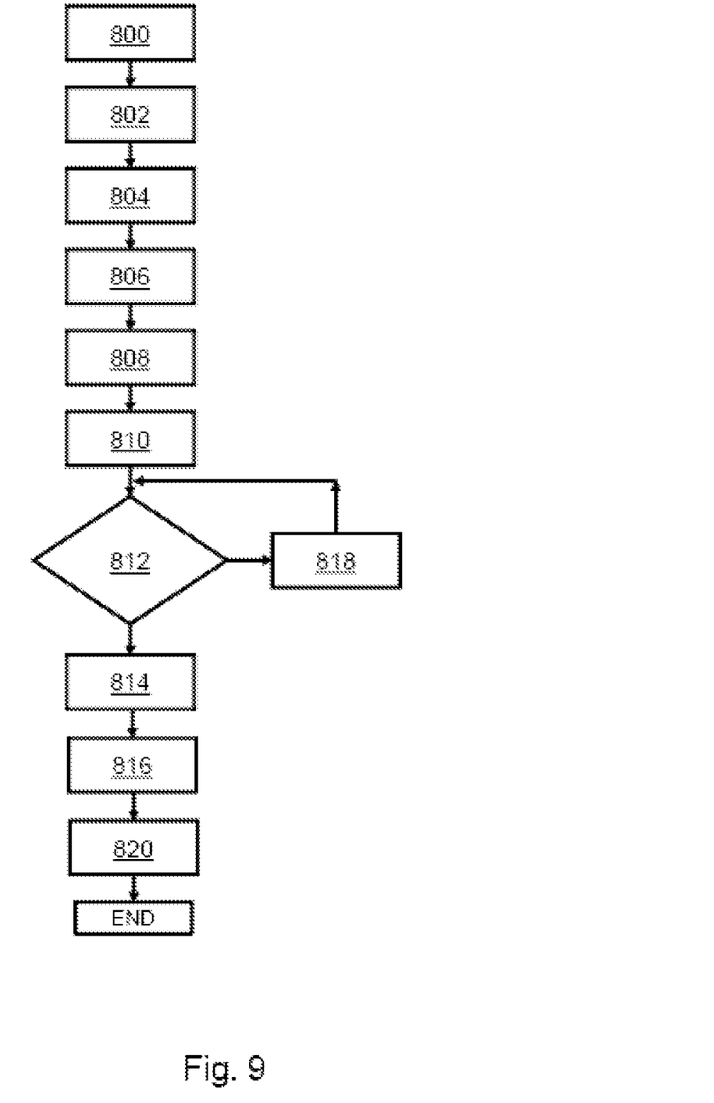
FIG. 9 a flowchart for stopping a counting process on an overflow of at least one skitter bin, according to an embodiment of the invention.

FIG. 9 shows a flowchart for stopping a counting process on an overflow of at least one skitter bin according to an embodiment of the invention. The process starts at step 800 with setting the mask register to one defined bin. A special case would be if no mask bit is set meaning that all increment counters are active, as explained in FIG. 8. Next the measurement duration is loaded in step 802 in order to prevent a timeout if no event occurs. Then in step 804 the mode bit is set to the mode for stopping a counting process on an overflow, followed by step 806 resetting the increment registers. In step 808 the test program is activated, followed by step 810, starting the measurement. In step 812, the signal any_ovfl and the comparator signal gt0 are polled. If the signal any_ovfl equals 1 and the comparator signal gt0 equals 1 a first clipping incrementer is identified in step 814 and the corresponding skitter bin increment value with a count value set to the maximum value is read in step 816. Since the counter stops automatically the duration can be determined now by subtracting the actual counter value from initial load value of the counter. Otherwise for gt0 equals 0 there was never an event on the signal any_ovfl and the increment content may be read in step 818. Finally in step 820 the test program is stopped and a probability to fail, dividing the increment value by the duration of the measurement, may be calculated. The process may then be looped over again with the next mask bit set to a desired skitter bin increment.

Figure 10:
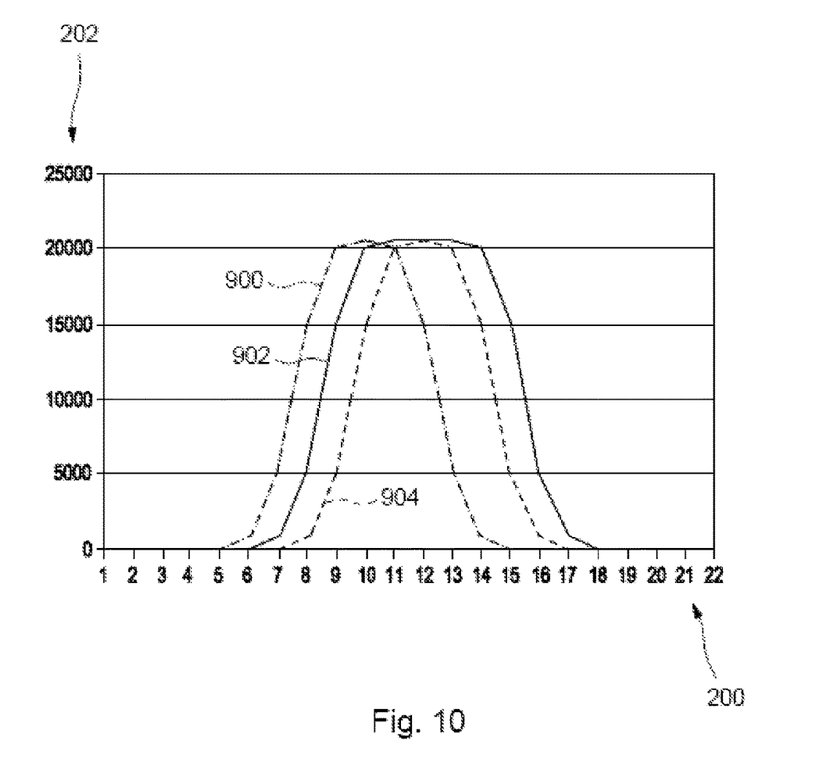
FIG. 10 an integrated measurement of voltage distributions of multiple computer systems enabling to perform corrective actions by shifting the mean voltage in a manufacturing area, according to an embodiment of the invention.

In FIG. 10 an integrated measurement of voltage distributions 900, 904 of two or more computer systems enabling to perform corrective actions by shifting the mean voltage at a manufacturing area according to the invention is shown. The curves 900 and 904 are distributions measured for two or more different computer systems, where curve 902 takes care for all skitter circuits from both or more computer systems as an integrated distribution, allowing to determine an overall probability for the computer systems to fail. Evaluating the entire integrated distribution 902 in case of a systematic shift into one direction a corrective action can be taken at the manufacturing area. Thus adjusting the voltage distribution of the computer system to a predetermined probability for the computer system to fail by changing a supply voltage of the computer system may be a possibility in order to increase the reliability of computer systems.

To summarize, it is one objective of the invention to provide a method for efficiently determining power noise of computer systems at manufacturing areas and customer operations. Another objective is to provide an apparatus for efficiently determining power noise of computer systems at manufacturing areas and customer operations. These objectives are achieved by the features of the independent claims. The other claims, the drawings and the specification disclose advantageous embodiments of the invention.

According to one aspect of the invention, a method is disclosed for determining a power noise histogram of a computer system, the computer system comprising a skitter circuit with multiple skitter bins, the skitter bins each being connected to a signal line at one or more clock cycles, comprising: (i) connecting each skitter bin to an individual counter circuit; (ii) incrementing a counter when the respective skitter bin is enabled.

Advantageously a method is presented to determine a power noise histogram of a computer system under real work load conditions to control voltage and guard band and fail probability using a skitter circuit, where the notion skitter is usually used for a combination of skew and jitter properties of a digital signal.

Favorably, the method is based on a correlation between a supply voltage of the computer system to fail and a bin position within a skitter circuit and a probability for the computer system to fail. A determination of a safety margin may be performed which corresponds to the probability for the computer system to fail.

The inventive method describes the use of a statistical voltage distribution over many events with respect to the speeds of signals travelling through the various skitter bins to derive power noise and voltage behaviour of a computer system. In this sense the notions skitter bin distribution and voltage distribution may be used synonymously in this description as the skitter bin position may be calibrated with a corresponding voltage value which is shown later.

In more detail, one or more aspects of the inventive method are based on identifying a critical voltage limit by identifying an individual distance of the supply voltage of the computer system to this critical voltage limit depending on workload, age, temperature at any time during computer system life time, where the workload and/or age are unknown during the measurement. An action may be implemented depending on the distance to the critical voltage limit and/or probability changes. A guard band may be reduced or increased by applying a pre-calculated desired safety margin. The supply voltage may be adjusted under the focus on power reduction.

The current skitter circuit design usually is not designed to support a customer usage/field application. Therefore, the design is extended by skitter bin-counters, which allows to determine a statistical power noise as well as a probability for the computer system to fail.

Advantageously, the inventive method may further comprise: (i) calibrating the skitter bins by determining a voltage corresponding to each skitter bin; (ii) defining a critical voltage limit; (iii) measuring a voltage distribution during computer system operation for a range of skitter bins; (iv) extrapolating the voltage distribution beyond the boundaries of the range of skitter bins; and (v) calculating a probability of the computer system from the extrapolated voltage distribution to reach the predefined critical voltage limit.

Advantages of the inventive method are to reduce a measurement time of a voltage distribution of the computer system by orders of magnitude, favorably by a factor of 100000, compared to conventional measurements of voltage distributions using an existing skitter circuit. A safety margin and/or a probability for the computer system to fail are thus adjustable. The test time may be optimized by finding out how long a dedicated testing program needs to be executed until a fail point is reached. Test conditions may thus be leveled in order to optimize test time and/or test quality.

In an advantageous embodiment, the voltage distribution may be sampled with an on-chip skitter counter circuit. Thus a very compact and efficient way of measuring the voltage distribution is presented as the counter circuit may be implemented on the same chip as the skitter circuit.

Further, a probability for the computer system to fail may be advantageously predicted based on the extrapolated voltage distribution. Extrapolating the voltage distribution may deliver a probability at some distant point from the center of gravity of the voltage distribution where the distance may be defined under quality or safety considerations of manufacturing responsible persons or a customer of the computer system.

Favorably, a correlation between the critical voltage limit and the probability for the computer system to fail may be calculated. This may be achieved by running the voltage distribution measurements at multiple supply voltage conditions of the computer system and at the same time observing a failing behavior of the computer system for the given supply voltage.

In an advantageous embodiment, a voltage corresponding to each skitter bin may be determined by measuring a distribution of counts for the multiple skitter bins of the skitter circuit for a signal with a defined voltage. By applying a defined supply voltage to the computer system and measuring a voltage distribution by the skitter circuit the skitter bins may be calibrated by registering a centre of gravity of the respective voltage distribution result. This defined supply voltage may then be assigned to the specific skitter bin corresponding to the centre of gravity of the voltage distribution.

Further, a critical voltage limit may be advantageously determined by reducing a supply voltage of the computer system registering a fail count of the computer system. The computer system may exhibit increasing fail counts by reducing the supply voltage. Thus a critical voltage limit may be determined by registering the corresponding skitter bin and corresponding voltage for a defined number of fails per given time unit.

Favorably, a voltage distribution may be measured during computer system operation for a range of skitter bins by registering a count distribution of the corresponding counter circuit. As each of the multiple skitter bins may be calibrated with a corresponding voltage value registering counts for each of the skitter bins and thus a count distribution may deliver a corresponding voltage distribution.

In accordance with one embodiment, the voltage distribution beyond the boundaries of the range of skitter bins may be extrapolated by approximating the voltage distribution for values smaller than a skitter bin resolution. Appropriate approximation functions may be used, such as, but not limited to, a Gaussian distribution, to approximate the voltage distribution over the measured skitter bin range. Thus values smaller than a skitter bin resolution may be interpolated resulting in function parameters for the approximation function that allow to extrapolate also the voltage distribution in a range beyond the boundaries of the range of skitter bins.

Advantageously, the probability for the computer system to fail may be calculated from the extrapolated voltage distribution by integrating the voltage distribution within the skitter bin range of the critical voltage limit. Integrated probability values in a range beyond the boundaries of the measuring range of skitter bins may be used to calculate for instance a probability for the computer system to fail or a critical voltage limit for a given probability to fail.

Further, the voltage distribution of the computer system may be favorably adjusted to a predetermined probability for the computer system to fail by changing a supply voltage of the computer system. Changing the supply voltage of the computer system may shift the voltage distribution to a range with an increased distance to a critical voltage limit and thus a reduced probability for the computer system to fail.

Alternatively, an executed program of the computer system may be adjusted to a predetermined probability for the computer system to fail by changing the executed program in a way that the resulting voltage distribution has a smaller width than before, staying at the same mean voltage. This means that the executed program may be adjusted to lowest noise possible and thus decreased probability of the computer system to fail.

Advantageously, stopping measuring a voltage distribution during computer system operation with multiple skitter bins may be initiated if at least one of the multiple counter circuits connected to the skitter bins is exhibiting an overflow. Thus a very efficient method for measuring a voltage distribution is implemented because no external trigger is needed for the skitter circuits to stop measurements. The overflow value may also be adjusted by setting a predefined mask value to the skitter bins in order to isolate individual skitter bins for single bin analysis, for instance. The trigger event by an overflow might even be initiated by a programmable compare value in a comparator circuit.

According to a further advantageous aspect of the invention, an apparatus for determining a power noise histogram of a computer system is provided, the computer system comprising a skitter circuit with multiple skitter bins, the skitter bins each being connected to a signal line at one or more clock cycles, comprising each skitter bin being connected to an individual counter circuit for incrementing a counter when the respective skitter bin is enabled. The above described inventive method for determining a power noise histogram of a computer system may favorably be implemented in an appropriate hardware in order to achieve a very efficient way of performing the desired measurements and extrapolations.

Advantageously, the apparatus further may comprise circuitry for: (i) calibrating the skitter bins by determining a voltage corresponding to each skitter bin; (ii) defining a critical voltage limit; (iii) measuring a voltage distribution during computer system operation for a range of skitter bins; (iv) extrapolating the voltage distribution beyond the boundaries of the range of skitter bins; (v) calculating a probability of the computer system from the extrapolated voltage distribution to reach the predefined critical voltage limit. The methodical circuit steps may be implemented in the appropriate hardware for performing safe and most efficient measurements in manufacturing and/or customer environments.

Favorably, the counter circuit may be implemented as an on-chip skitter counter circuit. A most compact embodiment may be a hardware implemented combined skitter counter circuit in a united environment.

In an advantageous embodiment, circuitry for extrapolating the voltage distribution beyond the boundaries of the range of skitter bins may be implemented on the on-chip skitter counter circuit. As a most efficient implementation calculation circuitry for extrapolation of voltage distributions may be integrated on an on-chip level.

Favorably, means for calculating a probability of the computer system to fail from the extrapolated voltage distribution may be implemented on the on-chip skitter counter circuit. Also the implementation of the calculation means for the probabilities on-chip may be a highly effective way for realizing the inventive method in an appropriate hardware.

What is claimed is:

1. A method comprising:
 determining a power noise histogram of a computer system, said computer system comprising a skitter circuit with multiple skitter bins, said skitter bins each being connected to a signal line at one or more clock cycles, the determining comprising:
  connecting each skitter bin to an individual counter circuit;
  incrementing a counter when the respective skitter bin is enabled;
 calibrating the skitter bins by determining a voltage corresponding to each skitter bin;
 defining a critical voltage limit;
 measuring a voltage distribution during computer system operation for a range of skitter bins;
 extrapolating the voltage distribution beyond the boundaries of the range of skitter bins; and
 calculating a probability of the computer system from the extrapolated voltage distribution to reach the predefined voltage limit.

2. The method of claim 1, further comprising sampling the voltage distribution with an on-chip skitter counter circuit.

3. The method of claim 1, further comprising predicting a probability for the computer system to fail based on the extrapolated voltage distribution.

4. The method of claim 3, further comprising calculating a correlation between the critical voltage limit and the probability for the computer system to fail.

5. The method of claim 1, further comprising determining a voltage corresponding to each skitter bin by measuring a distribution of counts for the multiple skitter bins of the skitter circuit for a signal with a defined voltage.

6. The method of claim 1, further comprising determining a critical voltage limit by reducing a supply voltage of the computer system registering a fail count of the computer system.

7. The method of claim 1, further comprising measuring a voltage distribution during computer system operation for a range of skitter bins by registering a count distribution of the corresponding counter circuit.

8. The method of claim 7, further comprising extrapolating the voltage distribution beyond the boundaries of the rage of skitter bins by approximating the voltage distribution for values smaller than a skitter bin resolution.

9. The method of claim 8, further comprising calculating the probability for the computer system to fail from the extrapolated voltage distribution by integrating the voltage distribution within the skitter bin range of the critical voltage limit.

10. The method of claim 7, further comprising adjusting the voltage distribution of the computer system to a predetermined probability for the computer system to fail by changing a supply voltage of the computer system.

11. The method of claim 7, further comprising adjusting an executed program of the system to a predetermined probability for the computer system to fail by changing the executed program in a way that the resulting voltage distribution has a smaller width than before, staying at the same mean voltage.

12. The method of claim 1, further comprising stopping measuring voltage distribution during computer system operation with multiple skitter bins if at least one of the multiple counter circuits connected to the skitter bins is exhibiting an overflow.

13. An apparatus for determining a power noise histogram of a computer system, said apparatus comprising:
   a skitter circuit with multiple skitter bins, said skitter bins each being connected to a signal line at one or more clock cycles;
   each skitter bin being connected to an individual counter circuit for incrementing a counter when the respective skitter bin is enabled;
   calibrating the skitter bins by determining a voltage corresponding to each skitter bin;
   defining a critical voltage limit;
   measuring a voltage distribution during computer operation for a range of skitter bins;
   extrapolating the voltage distribution beyond the boundaries of the range of skitter bins; and
   calculating a probability of the computer system from the extrapolated voltage distribution to reach the predefined critical voltage limit.

14. The apparatus of claim 13, wherein the counter circuit is implemented as an on-chip skitter counter circuit.

15. The apparatus of claim 14, wherein the circuitry for extrapolating the voltage distribution beyond the boundaries of the range of skitter bins is implemented on the on-chip skitter counter circuit.

16. The apparatus of claim 15, wherein the circuitry for calculating the probability of the computer system to fail from the extrapolated voltage distribution is implemented on the on-chip skitter counter circuit.

17. The apparatus of claim 14, wherein the circuitry for calculating the probability of the computer system to fail from the extrapolated voltage distribution is implemented on the on-chip skitter counter circuit.

* * * * *